(12) United States Patent
Chen et al.

(10) Patent No.: US 7,884,645 B2
(45) Date of Patent: Feb. 8, 2011

(54) VOLTAGE LEVEL SHIFTING CIRCUIT AND METHOD

(75) Inventors: Nan Chen, San Diego, CA (US); Ritu Chaba, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/023,276

(22) Filed: Jan. 31, 2008

(65) Prior Publication Data

US 2009/0195268 A1    Aug. 6, 2009

(51) Int. Cl.
*H03K 19/0175*    (2006.01)
(52) U.S. Cl. .............................. 326/81; 326/83; 326/86; 326/87; 327/333
(58) Field of Classification Search ............. 326/62–63, 326/68, 80–83, 86–87; 327/333
See application file for complete search history.

(56) References Cited

U.S. PATENT DOCUMENTS

| | | | | |
|---|---|---|---|---|
| 4,039,862 A | * | 8/1977 | Dingwall et al. | ............ 327/333 |
| 5,793,695 A | * | 8/1998 | Kohno | ................... 365/230.06 |
| 6,002,290 A | | 12/1999 | Avery et al. | |
| 2004/0246038 A1 | * | 12/2004 | Bucossi | ...................... 327/333 |
| 2007/0164789 A1 | | 7/2007 | Panjwani et al. | |
| 2007/0188194 A1 | | 8/2007 | Yang et al. | |

FOREIGN PATENT DOCUMENTS

EP    1263142    12/2002

OTHER PUBLICATIONS

International Search Report-PCT/US09/032203, International Search Authority-European Patent Office-Mar. 31, 2009.
Written Opinion-PCT/US09/032203, International Search Authority-European Patent Office-Mar. 31, 2009.

* cited by examiner

*Primary Examiner*—Rexford N Barnie
*Assistant Examiner*—Jany Tran
(74) *Attorney, Agent, or Firm*—Sam Talpalatsky; Nicholas J. Pauley; Peter M. Kamarchik (57) ABSTRACT

In a particular embodiment, a method includes receiving an input voltage at an input to a level shifting circuit that includes voltage pull-up logic. The method includes providing an output signal from the level shifting circuit. The method also includes selectively activating the voltage pull-up logic circuit of the level shifting circuit.

24 Claims, 5 Drawing Sheets

VOLTAGE LEVEL SHIFTING CIRCUIT AND METHOD

I. FIELD

The present disclosure is generally related to level shifting circuits and methods.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, wireless telephones can process executable instructions, including software applications, such as a web browser application, that can be used to access the Internet. As such, these wireless telephones can include significant computing capabilities.

In order to reduce power consumption and thus extend battery life of portable devices, power supplies operate electronic components at increasingly lower voltages. Although some components may operate well at low voltages, other components may require higher voltages. Thus, devices that include components that operate at different voltages may use level shifters to translate signals between the higher and lower voltages. Level shifter circuit designs often require a choice between improving response time to an input transition and improving a range of operation at low voltages. An increase in response time typically decreases the range of operation, while increasing the range of operation typically degrades response time. Thus, level shifters may limit performance of devices during low-power operation.

III. SUMMARY

In a particular embodiment, a circuit device is disclosed that includes an input to receive an input voltage signal and an output to provide a level shifted voltage signal. The circuit device includes a first weak state holding path coupled to the input and a second weak state holding path coupled to the output. The circuit device also includes a voltage pull-up logic circuit coupled to the first weak state holding path and to the second weak state holding path. The circuit device further includes a control path coupled to the voltage pull-up logic circuit to selectively control activation of the voltage pull-up logic circuit.

In another embodiment, a system is disclosed that includes a memory array and a first input coupled to the memory array by a first level shifting circuit. The system also includes a second input coupled to the memory array by a second level shifting circuit. The first level shifting circuit includes an input to receive the first input and an output to provide a first level shifted voltage signal to the memory array. The first level shifting circuit also includes a first weak state holding path coupled to the input. The first level shifting circuit further includes a second weak state holding path coupled to the output. The first level shifting circuit includes a voltage pull-up logic circuit coupled to the first weak state holding path and to the second weak state holding path. The first level shifting circuit also includes a control path coupled to the voltage pull-up logic circuit to selectively control activation of the voltage pull-up logic circuit.

In another embodiment, a device is disclosed that includes means for receiving an input voltage at an input to a level shifting circuit including voltage pull-up logic. The device also includes means for providing an output signal from the level shifting circuit. The device further includes means for selectively activating the voltage pull-up logic circuit of the level shifting circuit.

In another embodiment, a method is disclosed that includes receiving an input voltage at an input to a level shifting circuit that includes voltage pull-up logic. The method includes providing an output signal from the level shifting circuit. The method also includes selectively activating the voltage pull-up logic circuit of the level shifting circuit.

One particular advantage provided by the disclosed embodiments is a large voltage shifting range due to the weak state holding paths and a quick response to input signal transitions due to the voltage pull-up logic circuit. Another particular advantage is that operation of the level shifting circuit is relatively process tolerant.

Other aspects, advantages, and features of the present disclosure will become apparent after review of the entire application, including the following sections: Brief Description of the Drawings, Detailed Description, and the Claims.

V. DETAILED DESCRIPTION

Figure 1:
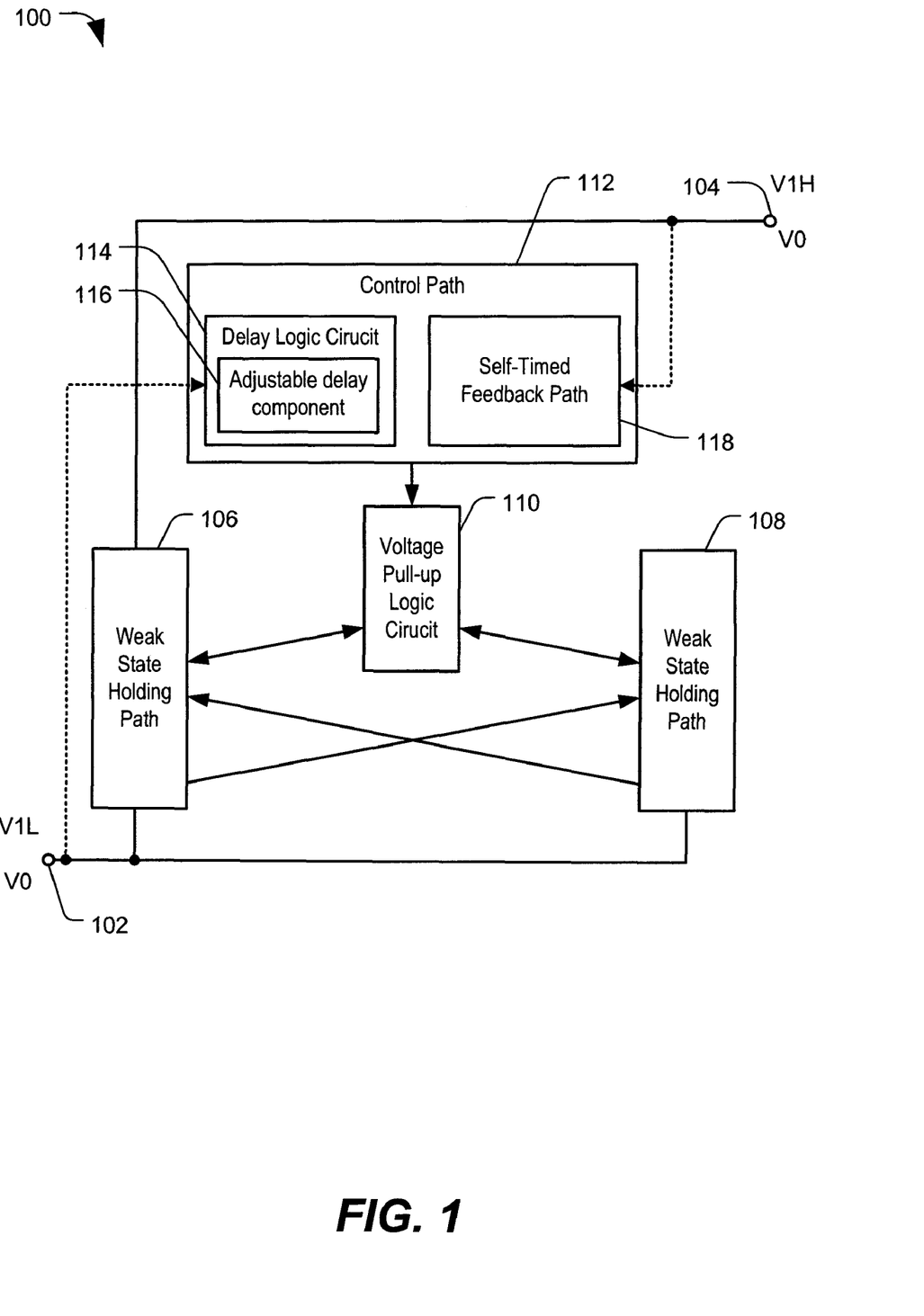
FIG. 1 is a block diagram of a first illustrative embodiment of a level shifting circuit device.

Referring to FIG. 1, a first illustrative embodiment of a level shifting circuit device is depicted and generally designated 100. The level shifting circuit device 100 includes an input 102 to receive an input voltage signal. An output 104 provides a level shifted voltage signal. A first weak state holding path 106 is coupled to the input 102 and to the output 104. The first weak state holding path 106 is cross-coupled to a second weak state holding path 108 that is also coupled to the input 102. A voltage pull-up logic circuit 110 is coupled to both the first weak state holding path 106 and the second weak state holding path 108. A control path 112 is coupled to provide a control signal to the voltage pull-up logic circuit 110.

In a particular embodiment, the input voltage signal received at the input 102 is within a first voltage range between a high state (V1L) and a low state (V0). In response to the input voltage signal, the first weak state holding path 106 generates a level shifted voltage signal at the output 104 that is within a second voltage range between a high state (V1H) and a low state (V0). In a particular embodiment, the first weak state holding path 106 and the second weak state holding path 108 are configured to enable level shifting of a large range of input voltages, including level shifting at or below 0.6-1.4 V. However, as a result of being able to operate over the large range of input voltages, the first weak state holding path 106 and the second weak state holding path 108 may exhibit relatively slow transition times in response to a transition of the input signal received at the input 102.

In a particular embodiment, the voltage pull-up logic circuit 110 is operative to improve the switching speed at the output 104 by providing current to the first weak state holding path 106 and to the second weak state holding path 108. The additional current provided by the voltage pull-up logic circuit 110 to the weak state holding paths 106 and 108 enables faster response to a transition of the input signal. In a particular embodiment, the voltage pull-up logic circuit 110 primarily operates to provide level shifting current to at least one of the first weak state holding path 106 and to the second weak state holding path 108 in response to a detected transition of the input signal received at the input 102. The voltage pull-up logic circuit 110 is responsive to the control path 112 to stop providing current to the weak state holding paths 106 and 108 to maintain sensitivity of the weak state holding paths 106 and 108 to low voltage signals at the input 102 during non-transition periods.

The control path 112 is adapted to selectively control activation of the voltage pull-up logic circuit 110. In a particular embodiment, the control path 112 includes a self-timed feedback path 118 from the output 104 to the voltage pull-up logic circuit 110. The control path 112 may be operative to detect a voltage level change at the output 104 and provide an activation signal to the voltage pull-up control logic 110 to turn off a current to one or more of the weak state holding paths 106 and 108 when the self-timed feedback path 118 determines a particular delay has elapsed based on a transition at the output 104.

In another embodiment, the control path 112 includes a delay logic circuit 114 coupled to the input 102. In this embodiment, the control path 112 is operative to detect a transition in the input 102 and to send an activation signal to the voltage pull-up logic circuit 110. The activation signal may cause the voltage pull-up logic circuit 110 to begin sourcing current to assist the weak state holding path 106, 108, or both, to transition between logic states. The control path 112 may further be operative to send a second control signal to the voltage pull-up logic circuit 110 in response to the delay logic circuit 114 determining a sufficient delay has elapsed since the transition of the input 102. The second control signal may deactivate the voltage pull-up logic circuit 110, resuming normal operation of the weak state holding paths 106 and 108 over the broad range of input voltages. In a particular embodiment, the delay logic circuitry 114 is adjustable, and may include an adjustable delay component 116 to control a delay associated with the second control signal.

During operation, a first input signal may be received at the input 102 from a first electronic component. The level shifting circuit device 100 may translate or shift the input voltage level and generate an output voltage level at the output 104. For example, the input signal may be received from a processor, a bus, a memory, or other electronic components and the output may be provided to a processor, a bus, a memory, or other electronic components. The first input signal may reflect the voltage levels V0 to V1L associated with a first power supply. The output 104 may be coupled to one or more other electronic components that operate at the second voltage levels V0 to V1H. As an illustrative example, the first voltage level may be a signal associated with a voltage range from 0 V to 1.0 V, and the second voltage level may be a signal associated with a voltage range from 0 V to 3.3 V.

In response to a transition at the input 102 to a second input signal, the first and second weak state holding paths 106 and 108 begin to transition between states. The voltage pull-up logic circuit 110 begins supplying current to the first weak state holding path 106, the second weak state holding path 108, or both, to assist in voltage level transition by supplying charge to one or more transistors. In a particular embodiment, the voltage pull-up logic circuit 110 begins to supply current in response to detecting that at least one of the weak state holding paths 106 and 108 have started to transition between states. In another embodiment, the voltage pull-up logic circuit 110 may instead begin to supply current in response to a control signal from the control path 112.

After a suitable delay period, such as via self-timed feedback path 118, or a delay logic circuit path 114, the control path 112 provides a control signal to deactivate the voltage pull-up logic circuit 110 to stop sourcing current to the weak state holding paths 106, 108. Following the deactivation of the voltage pull-up logic circuit 110, the cross-coupled weak state holding paths 106 and 108 maintain the new output voltage level at the output 104. By selectively activating the voltage pull-up logic circuit 110, a wide range of input operating voltages and a fast output level transition are both provided by the level shifting circuit device 100.

Figure 2:
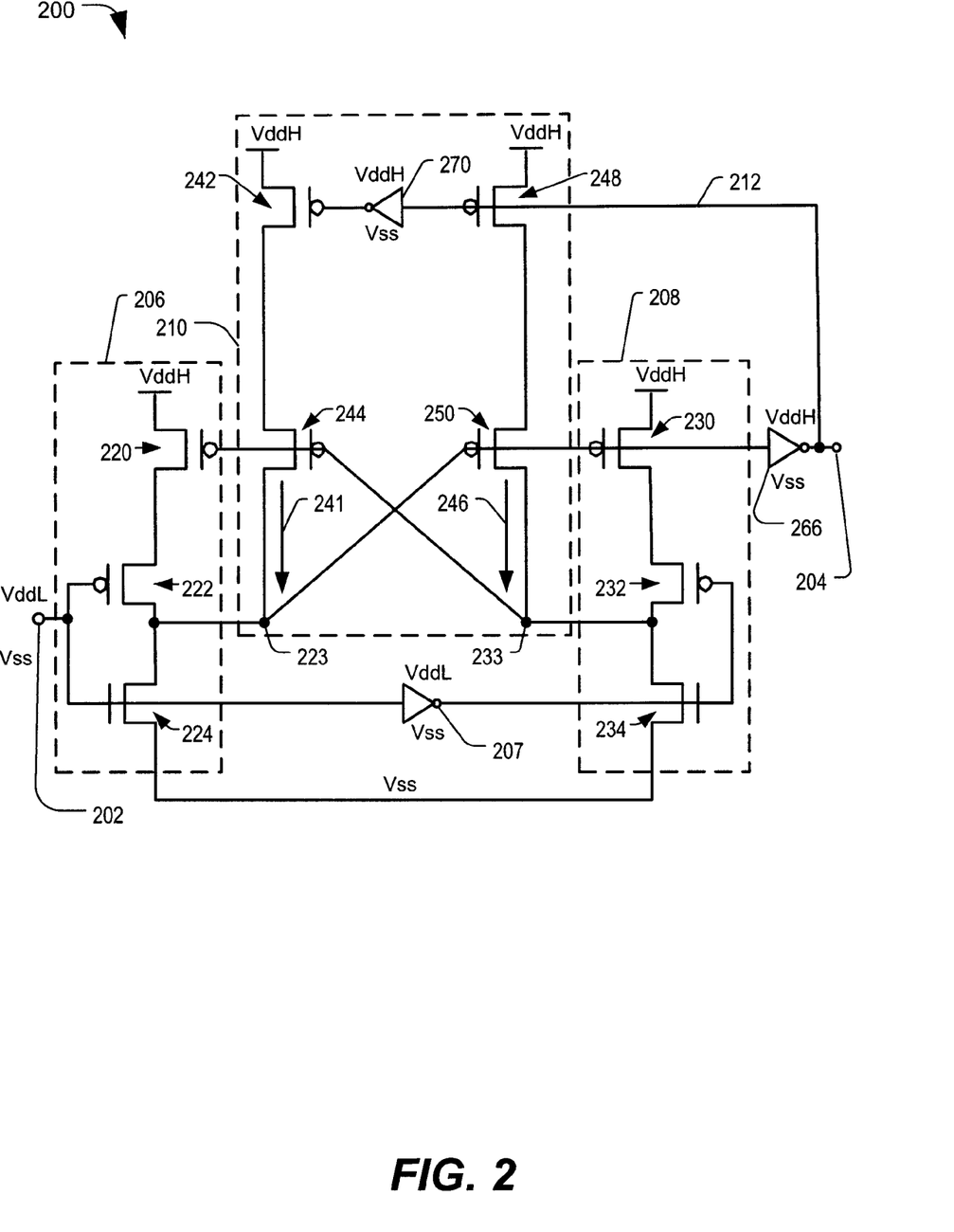
FIG. 2 is a circuit diagram of a second illustrative embodiment of a level shifting circuit device.

Referring to FIG. 2, a second illustrative embodiment of a level shifting circuit device is depicted and generally designated 200. The level shifting circuit device 200 includes an input 202 configured to receive an input signal corresponding to a first voltage range between a high voltage VddL and a low voltage Vss. The level shifting circuit device 200 also includes an output 204 configured to provide an output signal corresponding to a level shifting of the input 202 to a second voltage range, with a high signal represented by a high voltage VddH and a low signal represented by the low voltage Vss. The level shifting circuit device 200 also includes a first weak state holding path 206 and a second weak state holding path 208. The first weak state holding path 206 is coupled to the input 202, and the second weak state holding path 208 is coupled to the input 202 via an inverter 207 operating at the first voltage range. A voltage pull-up logic circuit 210 is coupled to both of the first weak state holding path 206 and to the second weak state holding path 208. A control path 212 is coupled to the voltage pull-up logic circuit 210 and to the output 204.

In a particular embodiment, the first weak state holding path 206 includes a first weak p-channel transistor 220 that has a first terminal coupled to a power supply voltage VddH, a control terminal coupled to the second weak state holding path 208, and a third terminal. The first weak state holding path 206 also includes a second weak p-channel transistor 222 including a fourth terminal that is coupled to the third terminal of the first weak p-channel transistor 220. The second weak p-channel transistor 222 has a second control terminal coupled the input 202, and a fifth terminal coupled a first node 223. The first node 223 is coupled to the voltage pull-up logic circuit 210. The first weak state holding path 206 also has a strong n-channel transistor 224 including a sixth terminal coupled to the first node 223, a third control terminal coupled to the input 202, and a seventh terminal coupled to a second power supply voltage Vss. As used herein, a strong transistor has a faster current response to a signal at a control terminal, such as a gate voltage, than a weak transistor, and may have a channel that is wider and shorter than a weak transistor. For example, the weak p-channel transistors 220 and 222 may be p-channel MOSFETs with channels that are approximately 0.12 micrometers (um) wide and 0.1 um long, and the strong n-channel transistor 224 may be an n-channel MOSFET with a channel that is approximately 0.6 um wide and 0.04 um long.

In a particular embodiment, the second weak state holding path 208 includes a first weak p-channel transistor 230 including a first terminal coupled to a power supply voltage VddH, a control terminal coupled to the first weak state holding path 206, and a third terminal coupled to a second weak p-channel transistor 232. The second weak p-channel transistor 232 includes a fourth terminal coupled to the third terminal of the first weak p-channel transistor 230, a second control terminal coupled to an output of the inverter 207, and a fifth terminal coupled to a second node 233. A strong n-channel transistor 234 has a sixth terminal coupled to the second node 233, a third control terminal coupled to the output of the inverter 207, and a seventh terminal coupled to the second power supply voltage Vss. The second node 233 of the second weak state holding path 208 is coupled to the first control terminal of the first weak p-channel transistor 220 of the first weak state holding path 206. Likewise, the first node 223 of the first weak state holding path 206 is coupled to the first control terminal of the first weak p-channel transistor 230 of the second weak state holding path 208.

The pull-up logic circuit 210 includes a first strong pull-up path 241 that is coupled to the second weak state holding path 208 and also includes a second strong pull-up path 246 that is coupled to the first weak state holding path 206. The first strong pull-up path 241 includes a first strong p-channel transistor 242 coupled to the power supply voltage VddH and having a control terminal coupled to the control path 212. The first strong pull-up path 241 has a second strong p-channel transistor 244 coupled to the first strong p-channel transistor 242 and further coupled to the first node 223. The second strong p-channel transistor 244 has a control terminal that is coupled to the second node 233.

Similarly, the second strong pull-up path 246 has a first strong p-channel transistor 248 that is coupled to the power supply voltage VddH and that has a control terminal coupled to the control path 212. The second strong pull-up path 246 also includes a second strong p-channel transistor 250 that is coupled between the first strong p-channel transistor 248 and the second node 233 and that has a control terminal coupled to the first node 223.

The output 204 is coupled to the first node 223 via an output inverter 266. The control path 212 is coupled to the output 204, to the control terminal of the first strong p-channel transistor 248 of the second strong pull-up path 246, and to the control terminal of the first strong p-channel transistor 242 of the first strong pull-up path 241 via an inverter 270. The control path 212 includes a self-timed feedback path from the output 204 to the voltage pull-up logic circuit 210. In particular, the voltage pull-up logic circuit 210 begins operating when one of the nodes 223 or 233 transitions from a low voltage level to a high voltage level, and continues operating until the voltage transition at the first node 223 propagates through the output inverter 266 to the control terminals of the transistors 242 and 248 of the strong pull-up paths 241 and 246. The resulting control signal provided by the control path 212 to the transistors 242 and 248 of the strong pull-up paths 241 and 246 deactivates the voltage pull-up logic circuit 210.

During steady-state operation, the voltage pull-up logic circuit 210 is off. In particular, at least one of the transistors 242 and 244 of the first strong current path 241 is off (i.e., non-conducting), and at least one of the transistors 248 and 250 of the second strong current path 246 is off.

When a low signal (e.g., Vss) is maintained at the input 202, the strong n-channel transistor 224 of the first weak state holding path 206 is off and the two weak p-channel transistors 220 and 222 are on, biasing the first node 223 at a high voltage (e.g., VddH, used in this context to include voltages that would be recognized as a "1" signal). The output inverter 266 has an input coupled to the first node 223, and outputs a low voltage (e.g., Vss, used in this context to include voltages that would be recognized as a "0" signal). The strong n-channel transistor 234 of the second weak state holding path 208 is on and the weak p-channel transistors 230 and 232 are off, biasing the second node 233 at a low voltage. In the voltage pull-up logic circuit 210, the first transistor 242 of the first strong pull-up path 241 is off and the second transistor 244 is on. Conversely, the first transistor 248 of the second strong pull-up path 246 is on and the second transistor 250 is off.

When the input 202 transitions from the low signal to a high signal (e.g., from Vss to VddL), the strong n-channel transistor 224 of the first weak state holding path 206 turns on, bringing the first node 223 from a high voltage state (e.g., VddH) to a low voltage state (e.g., Vss). During the transition, the weak p-channel transistors 220 and 222 operate at states determined by VddH and VddL. Although the weak p-channel transistor 222 may be on, fighting the n-channel transistor 234 to bias the first node at a high voltage state, the stronger n-channel transistor 224 pulls the first node to the low voltage state. Similarly, the strong n-channel transistor 234 of the second weak state holding path 208 turns off, bringing the second node 233 from a low voltage to a high voltage, but the transition is limited by the current flow through the weak p-channel transistor 232.

When the first node 223 transitions to the low state, however, the strong p-channel transistor 250 of the second strong pull-up path 246 is turned on, while the transistor 248 also remains on. Thus, current flows through the second strong pull-up current path 246 to charge the strong n-channel transistor 234. When the first node 223 transitions to the low state, the output inverter 266 transitions from a low state to a high state, which is provided via the control path 212 to the control terminal of the transistor 248, turning off the second strong pull-up path 246.

As the high signal (e.g., VddL) is maintained at the input 202, the strong n-channel transistor 224 of the first weak state holding path 206 remains on and the weak p-channel transistors 220 and 222 are off, biasing the first node 223 at a low voltage (e.g., VddL). The output inverter 266 outputs a high voltage (e.g., VddH). The strong n-channel transistor 234 of the second weak state holding path 208 is off, biasing the second node 233 at a high voltage. In the voltage pull-up logic circuit 210, the first transistor 242 of the first strong pull-up path 241 is on and the second transistor 244 is off. Conversely, the first transistor 248 of the second strong pull-up path 246 is off and the second transistor 250 is on.

When the input 202 transitions from the high signal to the low signal (e.g., from VddL to Vss), the output of the inverter 207 transitions from a low state to a high state, turning on the strong n-channel transistor 234 of the second weak state holding path 208 and bringing the second node 233 from a high voltage state to a low voltage state. During the transition, the weak p-channel transistors 230 and 232 operate at states determined by VddH and VddL. Although the weak p-channel transistor 232 may be on, fighting the n-channel transistor 234 to bias the second node at a high voltage state, the stronger n-channel transistor 234 pulls the second node to the low voltage state.

When the second node 233 transitions to the low voltage state, the strong p-channel transistor 244 of the first strong pull-up path 241 is turned on, while the transistor 242 remains on. In addition, the weak p-channel transistor 220 is also turned on. Thus, current flows through the first strong pull-up current path 241 and also the first weak state holding path 206 to charge the first node 222, while the strong n-channel transistor 224 is turned off. When the first node 223 transitions to the high state, the output inverter 266 transitions from a high state to a low state, which is provided via the control path 212 and the inverter 270 to the control terminal of the transistor 242, turning off the first strong pull-up path 241.

Thus, during a transition of the input 202, the initial transition of one of the nodes 223, 233 from a high state to a low state is limited by the respective weak p-channel transistors 220-222 or 230-232, but the transition of the other node 223 or 233 from the low state to a high state is assisted by the voltage pull-up control circuit 210. When the input 202 is held at a high or low signal, the voltage pull-up control circuit 210 is off and the cross-coupled weak state holding paths 206 and 208 remain sensitive to low voltage input ranges at the input 202. When a transition occurs at the input 202, the voltage pull-up logic circuit 210 activates to supply current to the weak state holding paths 206 and 208 to accelerate a transition to the new state. The voltage pull-up logic circuit 210 deactivates in response to the control path 212 indicating a transition at the output 204. The voltage pull-up logic circuit 210 therefore provides a pulse of current to assist the weak state holding paths 206 and 208 transition between states in response to the input 202. By selectively activating the voltage pull-up logic circuit 210, a wide range of input operating voltages and a fast output level transition are both provided by the level shifting circuit device 200.

Figure 3:
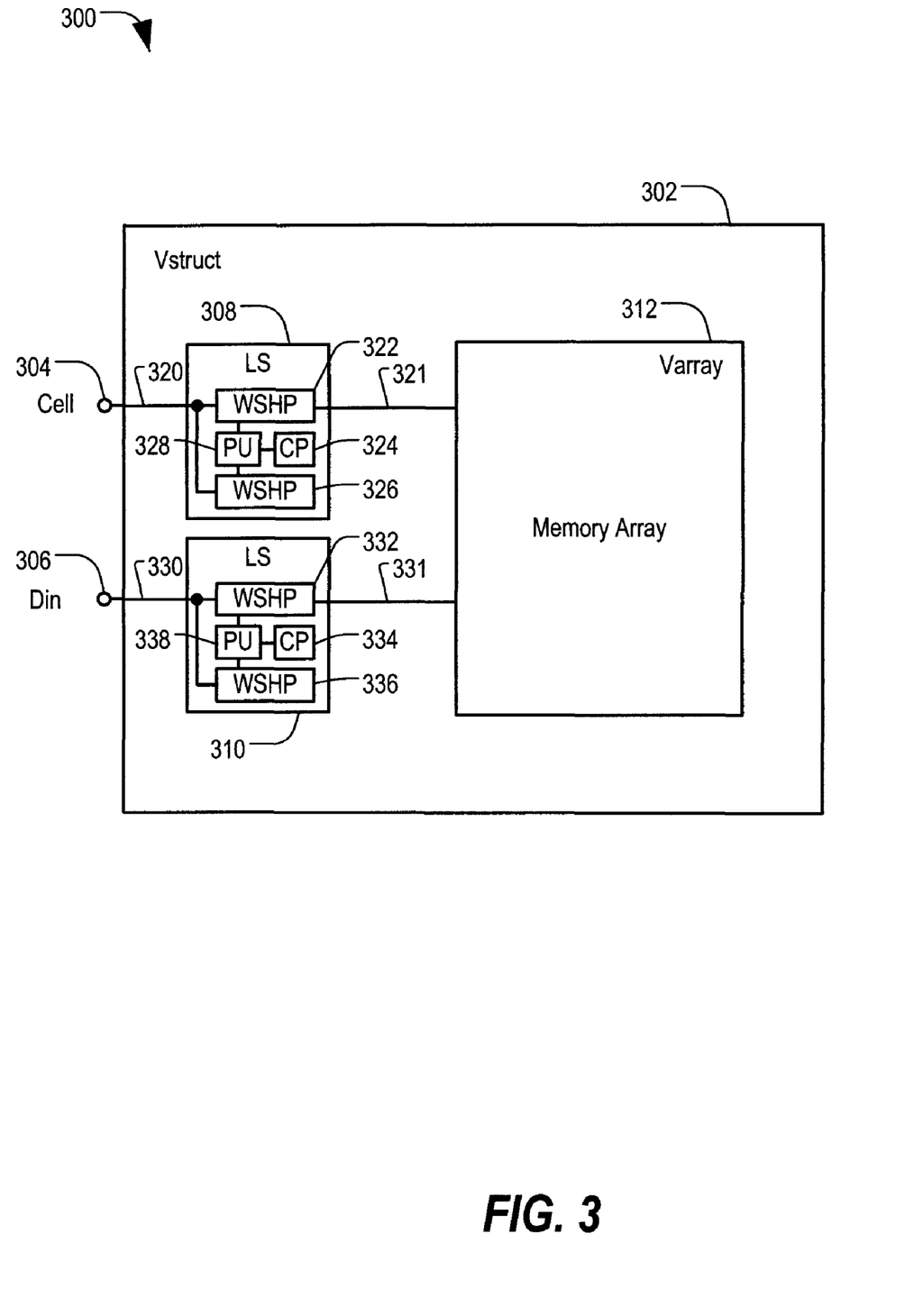
FIG. 3 is a block diagram of a particular illustrative embodiment of a system including a level shifting circuit device.

FIG. 3 is a block diagram of a particular illustrative embodiment of a system 300 including a level shifting circuit device. A structure 302 includes a first input 304 coupled to receive a memory cell selection signal. A second input 306 is coupled to receive a data signal. The first input 304 is provided to a first level shifting circuit 308, and the second input 306 is provided to a second level shifting circuit 310. A memory array 312 is coupled to receive an output of the first level shifting circuit 308 and the second level shifting circuit 310. The structure 302 operates at a first voltage level Vstruct, and the memory array 312 operates at a second voltage level Varray.

The first level shifting circuit 308 includes an input 320 to receive the first input 304 and an output 321 to provide a first level shifted voltage signal to the memory array 312. The first level shifting circuit 308 includes a first weak state holding path 322 coupled to the input 320 and to the output 321. The first weak state holding path 322 is also coupled to a cross-coupling circuit, such as a second weak state holding path 326. A voltage pull-up logic circuit 328 is coupled to the first weak state holding path 322 and to the second weak state holding path 326. A control path 324 is coupled to the voltage pull-up logic circuit 328 to selectively control activation of the voltage pull-up logic circuit 328. In a particular embodiment, the first level shifting circuit 308 may include the level shifting circuit device 100 or 200 illustrated in FIGS. 1-2.

The second level shifting circuit 310 includes an input 330 to receive the second input 306 and an output 331 to provide a first level shifted voltage signal to the memory array 312. In a particular embodiment, the second level shifting circuit 310 includes a first weak state holding path 332 coupled to the input 330 and to the output 331. The first weak state holding path 332 is also coupled to a cross-coupling circuit, such as a second weak state holding path 336. A voltage pull-up logic circuit 338 is coupled to the first weak state holding path 332 and to the second weak state holding path 336. A control path 334 is coupled to the voltage pull-up logic circuit 338 to selectively control activation of the voltage pull-up logic circuit 338. In a particular embodiment, the second level shifting circuit 310 may include the level shifting circuit device 100 or 200 illustrated in FIGS. 1-2.

During operation, at least one of the first input 304 and the second input 306 may be at a first voltage level, such as Vstruct, but the memory array 312 may be powered by a power source at a second voltage level, such as Varray. For example, the first voltage level may be less than the second voltage level. The level shifting circuits 306 and 308 may shift voltage levels at the inputs 304 and 306 to voltage levels appropriate for the memory array 312. In a particular embodiment, the level shifting circuits 306 and 308 include pull-up logic circuits 328 and 338 that are selectively activated by the control paths 324 and 334, respectively, thus enabling fast transitions in response to changes in input signals and also enabling a wide range of operation. For example, the level shifting circuits 306 and 308 may be operable in a voltage range including 0.6-1.4 V.

Figure 4:
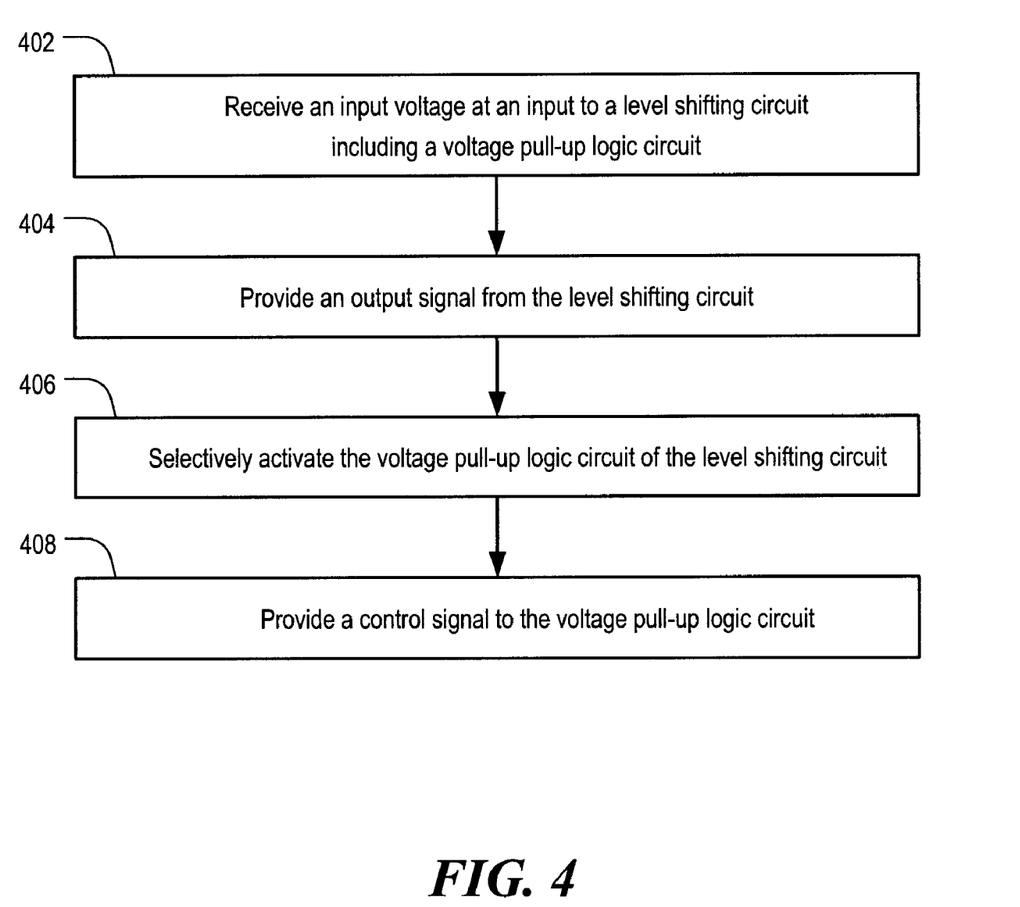
FIG. 4 is a flow diagram of a particular illustrative embodiment of a method of level shifting using a circuit device, such as the circuit devices illustrated in FIGS. 1-3.

FIG. 4 is a flow diagram of a particular illustrative embodiment of a method of level shifting using a circuit device, such as the circuit devices illustrated in FIGS. 1-3. At 402, an input voltage is received at an input to a level shifting circuit that includes voltage pull-up logic. In a particular embodiment, the input signal is applied to a first weak state holding path. The first weak state holding path may include multiple weak p-channel transistors and a strong n-channel transistor arranged in series.

Moving to 404, an output signal is provided from the level shifting circuit. In a particular embodiment, the input signal has a first voltage and the output signal has a second voltage. Advancing to 406, the voltage pull-up logic circuit of the level shifting circuit is selectively activated. In a particular embodiment, the voltage pull-up logic circuit provides charge to decrease a transition time of a weak state holding path.

Continuing to 408, in a particular embodiment, a control signal is provided to the voltage pull-up logic circuit. The control signal may be a feedback signal responsive to the output signal. In a particular embodiment, the control signal causes the voltage pull-up logic circuit to discontinue charging a weak state holding path. In a particular embodiment, an output of the voltage pull-up logic circuit includes a current pulse that begins in response to the input signal and that ends in response to the control signal.

Figure 5:
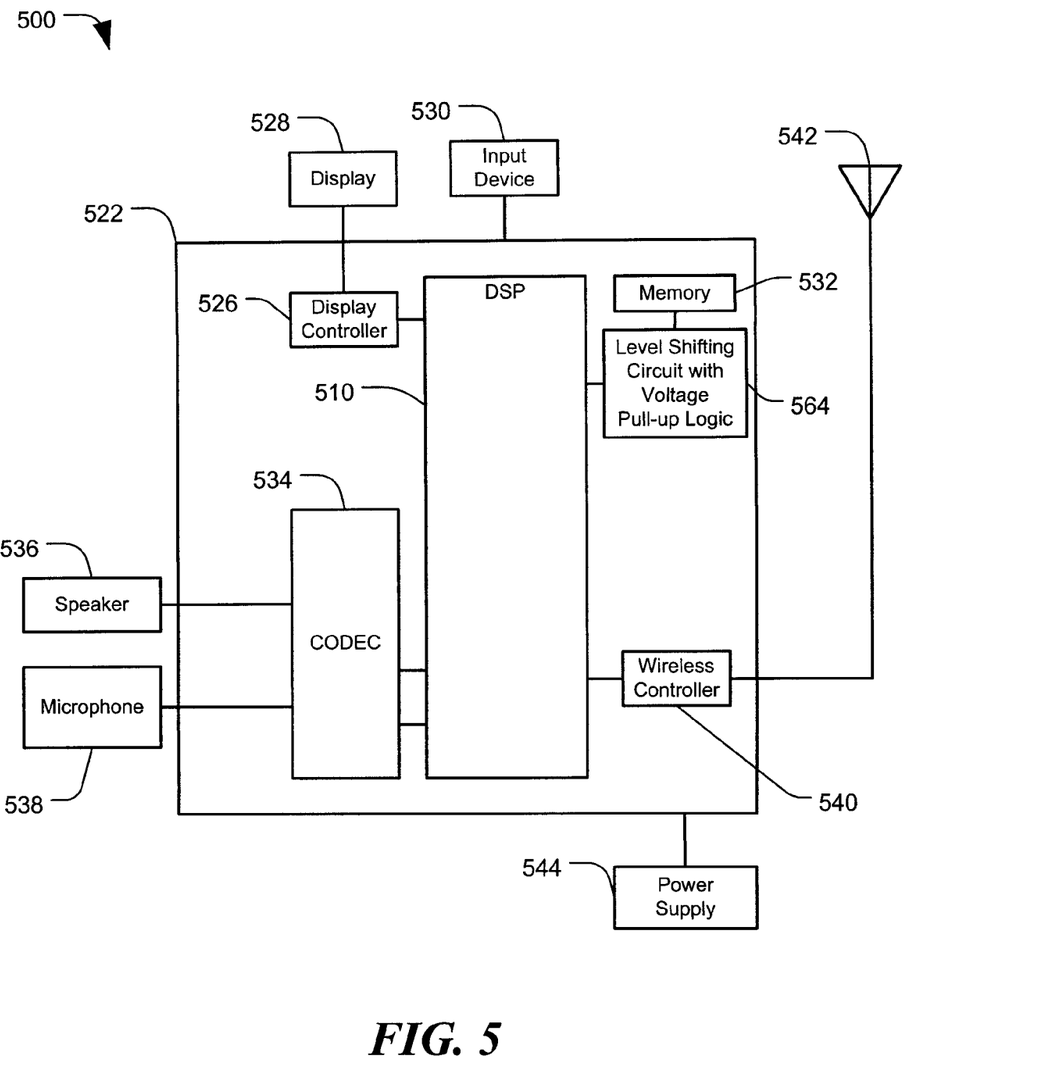
FIG. 5 is a block diagram of a representative mobile communication device in which embodiments of the circuits and methods described in FIGS. 1-4 may be used.

FIG. 5 is a block diagram of a representative mobile communications device 500 in which embodiments of the circuits and methods described in FIGS. 1-4 may be used. The communications device 500 includes a processor, such as a digital signal processor (DSP) 510. A level shifting circuit with voltage pull-up logic 564 is coupled to the DSP 510 to provide a voltage level shift between the DSP 510 and a memory device 532. In an illustrative embodiment, the level shifting circuit with voltage pull-up logic 564 includes the circuit device 100, 200, 308, or 310 illustrated in FIGS. 1-3. In an illustrative embodiment, the level shifting circuit with voltage pull-up logic 564 performs the method illustrated in FIG. 4.

FIG. 5 also shows a display controller 526 that is coupled to the digital signal processor 510 and to a display 528. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to a wireless antenna 542. In a particular embodiment, an input device 530 and a power supply 544 are coupled to the on-chip system 522. Moreover, in a particular embodiment, as illustrated in FIG. 5, the display 528, the input device 530, the speaker 536, the microphone 538, the wireless antenna 542, and the power supply 544 are external to the on-chip system 522. However, each can be coupled to a component of the on-chip system 522, such as an interface or a controller.

Although the level shifting circuit with voltage pull-up logic 564 is depicted as coupled to provide a level shift between the DSP 510 and the memory device 532, the level shifting circuit with voltage pull-up logic 564 may also be used to provide level shifting between other components of the communications device 500 that use different voltage levels. For example, the level shifting circuit with voltage pull-up logic 564 may be coupled between the on-chip system 522 and the display 528, the input device 530, the speaker 536, the microphone 538, the wireless antenna 542, the power supply 544, or any combination thereof. As another example, the level shifting circuit with voltage pull-up logic 564 may be coupled between the DSP 510 and any other component of the on-chip system 522. As yet another example, the level shifting circuit with voltage pull-up logic 564 may be integrated with the DSP 510 to provide level shifting for components of the DSP 510, such as at a register file that operates at a lower voltage level within the DSP 510.

In conjunction with the systems and methods disclosed, voltage level shifting may be performed by a device that includes means for receiving an input voltage at an input to a level shifting circuit that includes voltage pull-up logic, such as, for example, the inputs 102, 202, 320, and 330, illustrated in FIGS. 1-3. The device may also include means for providing an output signal from the level shifting circuit, such as, for example, the outputs 104, 204, 321, and 331 and the corresponding circuit structures coupled to the respective outputs as illustrated in FIGS. 1-3. The device may also include means for selectively activating the voltage pull-up logic circuit of the level shifting circuit, such as the control paths 112, 212, 324, and 334, as illustrated in FIGS. 1-3.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A circuit device comprising:
   a voltage level shifter comprising a single input to receive an input voltage signal and an inverting output to provide a level shifted voltage signal that is inverted relative to the input voltage signal, the voltage level shifter further comprising:
   a first weak state holding path coupled to the single input, wherein the first weak state holding path comprises a first n-channel field effect transistor (NFET) serially coupled to a first p-channel field effect transistor (PFET);
   a second weak state holding path coupled to the inverting output, wherein the second weak state holding path comprises a second NFET serially coupled to a second PFET;
   a first inverter responsive to the input voltage signal, wherein the second NFET and the second PFET are responsive to an output of the first inverter, wherein the first inverter controls the second NFET and the second PFET to respond to a complement of the input voltage signal while the first NFET and the first PFET are responsive to the input voltage signal;
   a voltage pull-up logic circuit coupled to the first weak state holding path and to the second weak state holding path; and
   a control path coupled to the voltage pull-up logic circuit to selectively control activation of the voltage pull-up logic circuit in response to a transition of a buffer output of a buffer, wherein the buffer has an input coupled to the inverting output;
   wherein the buffer enables control of the voltage pull-up logic circuit to be responsive to a load applied to the buffer output while a switching response of the second weak state holding path to a transition of the input voltage signal is substantially unaffected by the load.

2. The circuit device of claim 1, wherein the control path comprises a self-timed feedback path from the buffer output to the voltage pull-up logic circuit.

3. The circuit device of claim 1, wherein the control path couples the single input to the voltage pull-up logic circuit.

4. The circuit device of claim 3, wherein the control path comprises a delay logic circuit to provide a timing delay.

5. The circuit device of claim 4, wherein the delay logic circuit comprises an adjustable delay component.

6. The circuit device of claim 1, wherein the first weak state holding path comprises:
   a first weak PFET comprising a first terminal coupled to a power supply voltage, a control terminal coupled to the second weak state holding path, and a third terminal;
   the first PFET comprising a fourth terminal coupled to the third terminal, a second control terminal coupled to the single input, and a fifth terminal coupled to a node, the node coupled to the voltage pull-up logic circuit; and the first NFET comprising a sixth terminal coupled to the node, a third control terminal coupled to the single input, and a seventh terminal coupled to a second power supply voltage.

7. The circuit device of claim 1, wherein a first strong pull-up path and a second strong pull-up path are coupled via a third inverter.

8. The circuit device of claim 1, wherein the first weak state holding path and the second weak state holding path are coupled via the first inverter.

9. The circuit device of claim 8, wherein the first weak state holding path is coupled to the second strong pull-up path and wherein the second weak state holding path is coupled to the first strong pull-up path.

10. The circuit device of claim 1, wherein the buffer comprises a second inverter that is coupled to an element of the second weak state holding path.

11. The circuit device of claim 10, wherein the second inverter comprises an inverter input and an inverter output, wherein the inverter input is coupled to the second weak state holding path and the inverter output is coupled to the control path.

12. A system comprising:
a memory array;
a first input coupled to the memory array by a first level shifting circuit;
a second input coupled to the memory array by a second level shifting circuit;
wherein the first level shifting circuit comprises:
a voltage level shifter comprising a single input to receive the first input and an inverting output to provide a first level shifted voltage signal that is inverted relative to the first input to a buffered output of a buffer, the buffered output coupled to the memory array, the voltage level shifter further comprising:
a first weak state holding path coupled to the single input and coupled to the buffered output, wherein the first weak state holding path comprises a first n-channel field effect transistor (NFET) serially coupled to a first p-channel field effect transistor (PFET);
a second weak state holding path coupled to the inverting output, wherein the second weak state holding path comprises a second NFET serially coupled to a second PFET;
an inverter responsive to the first input, wherein the second NFET and the second PFET are responsive to an output of the inverter, wherein the inverter controls the second NFET and the second PFET to respond to a complement of the first input while the first NFET and the first PFET are responsive to the first input;
a voltage pull-up logic circuit coupled to the first weak state holding path and to the second weak state holding path; and
a control path coupled to the voltage pull-up logic circuit and responsive to the buffered output of the buffer to selectively control activation of the voltage pull-tip logic circuit, wherein the buffer has an input coupled to the inverting output;
wherein the buffer enables control of the voltage pull-up logic circuit to be responsive to a load applied to the buffer output while a switching response of the second weak state holding path to a transition of the input voltage signal is substantially unaffected by the load.

13. The system of claim 12, wherein the memory array is powered by a power source at a second voltage level and wherein at least one of the first input and the second input are at a first voltage level.

14. The system of claim 13, wherein the first voltage level is less than the second voltage level.

15. The system of claim 12, wherein the buffer comprises a second inverter having an inverter input and an inverter output, wherein the inverter input is coupled to the second weak state holding path and the inverter output is coupled to the control path.

16. A method comprising:
at a voltage level shifter of a circuit device, the voltage level shifter comprising a single input and an inverting output,
receiving an input voltage signal at the single input to the voltage level shifter, the voltage level shifter further comprising a voltage pull-up logic circuit;
providing a level shifted output signal that is inverted relative to the input voltage signal from the inverting output of the voltage level shifter to a buffer coupled to generate a buffered level shifted output to the voltage pull-up logic circuit, wherein the buffer has an input coupled to the inverting; and
selectively activating the voltage pull-up logic circuit of the voltage level shifter in response to a logical transition of the buffered level shifted output,
wherein the voltage level shifter comprises:
a first weak state holding path coupled to the single input, wherein the first weak state holding path comprises a first n-channel field effect transistor (NFET) serially coupled to a first p-channel field effect transistor (PFET);
a second weak state holding path coupled to the inverting output, wherein the second weak state holding path comprises a second NFET serially coupled to a second PFET; and
an inverter responsive to the input voltage signal, wherein the second NFET and the second PFET are responsive to an output of the inverter, wherein the inverter controls the second NFET and the second PFET to respond to a complement of the input voltage signal while the first NFET and the first PFET are responsive to the input voltage signal;
wherein the buffer enables control of the voltage pull-up logic circuit to be responsive to a load applied to the buffer output while a switching response of the second weak state holding path to a transition of the input voltage signal is substantially unaffected by the load.

17. The method of claim 16, further comprising providing a control signal to the voltage pull-up logic circuit.

18. The method of claim 17, wherein the control signal is a feedback signal responsive to the buffered level shifted output.

19. The method of claim 16, wherein the input voltage signal has a first voltage and the inverting output has a second voltage.

20. The method of claim 16, wherein the first weak state holding path comprises multiple weak PFETs and a strong NFET arranged in series.

21. A device comprising:
a voltage level shifter having a single input and an inverting output, the voltage level shifter comprising:
means for receiving an input voltage signal at the single input to the voltage level shifter, the voltage level shifter further comprising voltage pull-up logic;
means for providing a level shifted buffered output signal that is inverted relative to the input voltage signal from the inverting output of the voltage level shifter to the voltage pull-up circuit, wherein the buffered output signal is provided from a buffer of the voltage level shifter, wherein the buffer has an input coupled to the inverting output; and means for selectively activating the voltage pull-up logic circuit of the voltage level shifter in response to the level shifted buffered output signal, wherein the voltage level shifter comprises:

- a first weak state holding path coupled to the single input, wherein the first weak state holding path comprises a first n-channel field effect transistor (NFET) serially coupled to a first p-channel field effect transistor (PFET);
- a second weak state holding path coupled to the inverting output, wherein the second weak state holding path comprises a second NFET serially coupled to a second PFET; and
- an inverter responsive to the input voltage signal, wherein the second NFET and the second PFET are responsive to an output of the inverter, wherein the inverter controls the second NFET and the second PFET to respond to a complement of the input voltage signal while the first NFET and the first PFET are responsive to the input voltage signal;

wherein the buffer enables control of the voltage pull-up logic circuit to be responsive to a load applied to the buffer output while a switching response of the second weak state holding path to a transition of the input voltage signal is substantially unaffected by the load.

22. The device of claim 21, further comprising means for providing a control signal to the voltage pull-up logic circuit.

23. The device of claim 22, wherein the control signal is a feedback signal responsive to the buffered output signal.

24. The device of claim 21, wherein the buffer comprises a second inverter.

* * * * *